MASKING TECHNIQUE FOR AREA REDUCTION OF PLANAR TRANSISTORS

Filed Dec. 21, 1965

PRIOR ART

INVENTORS
FRED BARSON
LUBERTUS L. KUIPER

BY Joseph C. Redmond Jr.

ATTORNEY

United States Patent Office 3,477,123

Patented Nov. 11, 1969

3,477,123

MASKING TECHNIQUE FOR AREA REDUCTION OF PLANAR TRANSISTORS

Fred Barson, Wappingers Falls, and Lubertus L. Kuiper, Fishkill, N.Y., assignors to International Business Machines Corporation, Armonk, N.Y., a corporation of New York Filed Dec. 21, 1965, Ser. No. 515,327
Int. Cl. B01j *17/00;* H01l *5/00*
U.S. Cl. 29—578 3 Claims

ABSTRACT OF THE DISCLOSURE

A method of masking areas for diffusion to fabricate planar transistors wherein the emitter mask and a collector mask are designed to be placed in an overlapping arrangement with the resultant reduction in area of the required base area.

Figures 1A, 1B, 1C:
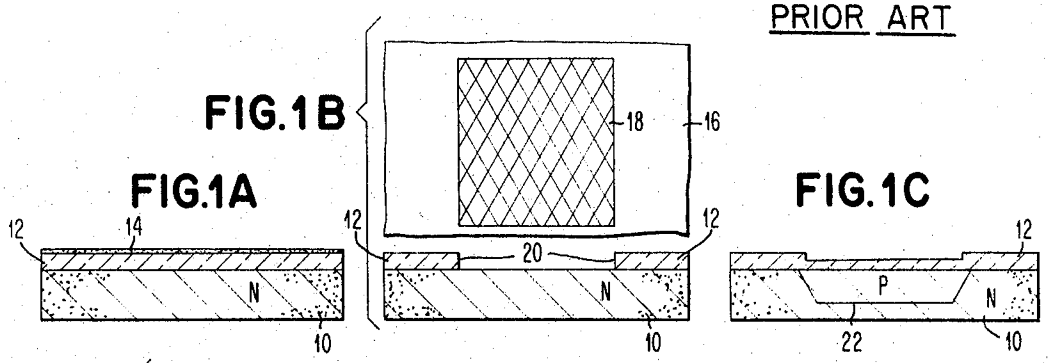

This invention relates to methods of manufacturing semiconductor devices and, more particularly, to methods and material for producing precise oxide masks on semiconductor material by etch resist technique.

High speed semiconductor devices require tight junction geometry to obtain minimum collector-base junction length and maximum emitter area. These criteria reduce collector capacitance and emitter current density, respectively.

Photolithographic masking techniques, as described in U.S. Patent 3,122,817 to J. Andrus, issued Mar. 3, 1964, permit the formation of junction geometry in semiconductor devices. Silicon dioxide is used as the masking material. One problem in fabricating semiconductor devices is the requirement for clearance between successive masks. In very small devices, clearances for mask alignment are an appreciable fraction of the total device area. Large clearance areas increase collector-base junction areas and decrease emitter areas. A second problem is the difficulty of aligning the mask to prevent overlap between successive masks which would render the resulting device defective. With the solution of these problems, semiconductor device performance may be improved with a resulting reduction in the cost of manufacture.

A general object of the present invention is an improved masking process for fabricating semiconductor devices.

Another object is a method of fabricating semiconductor devices with reduced clearance spacing between successive masking steps.

Another object is a method of fabricating semiconductor devices of relatively close junction geometry.

Another object is a method of fabricating semiconductor devices which reduces operator error in mask alignment.

These and other objects are accomplished in accordance with the present invention one illustrative embodiment of which comprises the steps of growing, depositing or otherwise forming an insulating film, typically an oxide layer of a thickness greater than 5000 to 6000 angstroms and less than 9000 to 10000 angstroms on a semiconductor wafer. Coating the oxide surface with a photographic resist material by brushing, dipping, spraying or the like. Superimposing a first mask over the photographic resist material, after drying, the mask being opaque and transparent in a pattern descriptive of the geometry desired to be formed in the photoresist material. Exposing, through the first mask, the photographic resist material with a light source, to print the pattern in the resist material. Removing the unexposed photographic resist material and etching exposed silicon dioxide with a suitable etch to expose the semiconductor material. Diffusing through the silicon dioride opening an impurity to change the semiconductor material to a first conductivity type. Reforming silicon dioxide on the exposed silicon and other surfaces of the wafer, the second silicon dioxide coating having a thickness greater than 1000 angstroms and less than 4000 angstroms. Repeating the coating, etching and diffusion operations, with a second mask, to establish a second conductivity type material within the first conductivity type material, the second mask overlapping the first mask pattern without rendering the resulting device inoperative. Repeating the reforming and coating operations to establish contact openings in the oxide. The contact mask pattern overlapping the first mask pattern, and depositing metal in the contact openings to complete the fabrication of a semiconductor device.

One feature of the present invention is an insulating film, typically an oxide coating of a thickness greater than 5000 to 6000 angstroms but less than 9000 to 10,000 angstroms, which permits mask alignment between first and second mask to be non-critical in establishing junction geometry in a semiconductor device.

A second feature is overlapping the first mask pattern with the second mask pattern to reduce the size of the base area within the collector area and increase the emtiter area within the base area.

Another feature is the use of a second overlapping mask with respect to the first mask to establish contact openings in the oxide for base and emitter contacts.

The foregoing and other objects, features and advantages of the invention will be apparent from the following more particular description of preferred embodiments of the invention, as illustrated in the accompanying drawings.

FIGURES 1A through 1E describe process steps employed in prior art masking techniques for fabricating semiconductor devices.

FIGURES 2A through 2D describe the process steps of the present invention in fabricating semiconductor devices.

Figure 3:
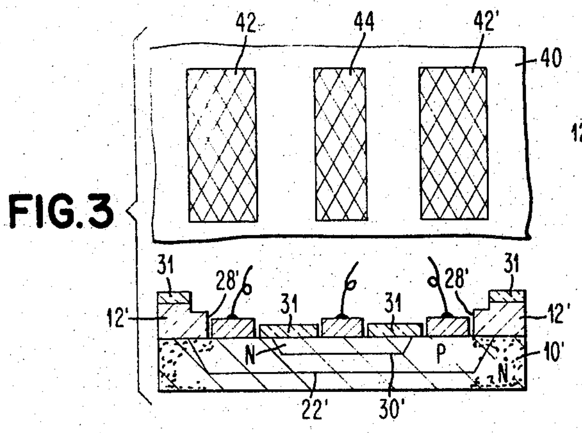

FIGURE 3 describes the process step of establishing contacts on a semiconductor using the principles of the present invention.

A description of the prior art steps in fabricating semiconductor devices is believed to be in order to highlight the differences of the present invention with respect thereto. Semiconductor devices are fabricated from a single crystal silicon wafer 10, as shown in FIGURE 1A. The wafer has a diameter of approximately 1.5 inches and is 0.01 inch thick. Approximately 1100 individual devices may be fabricated in the wafer. FIGURE 1A represents one unit cell in the wafer. The dimensions of the unit cell are approximately 25 mils by 25 mils. The wafer is prepared by any one of several processes, dendritic web and Czochralski crystal pulling. After suitable cleaning and polishing, one surface of the wafer is subjected to an oxidizing treatment which will produce a layer 12 of substantially silicon dioxide ($SiO_2$). The oxide may be formed by anodization, evaporation or thermal growth processes, all well known in the art. The thickness of the oxide is of the order of 4000 angstroms. Thereafter, the oxide is coated with a photographic resist material 14 which advantageously may be any one of the compositions disclosed in Patents 2,670,285, 2,670,286, and 2,670,287 of Louis M. Minsk et al. Also, a material sold by Eastman Kodak Co., Rochester, N.Y., under the trademark KPR (Kodak Photo Resist) may be employed. Conventional methods of applying such a coating may be employed, such as brushing, dipping, spraying or the like, which may be followed by a whirling operation to insure uniform and thin resist layer. Prior to applying the resist material, the oxide surface must be cleaned by the use of a suitable cleaning agent, for example, benzol, toluene, or like solvent.

The wafer is next ready for an etching operation which will expose the silicon wafer 10 for a diffusion operation. Referring to FIGURE 1B, a mask 16 is disposed in co-planar relationship with the wafer. FIGURE 1B shows the mask elevated to better describe the feature thereof. The mask is made of glass, plastic, or related material. Sections thereof are transparent or opaque depending where openings are to be made in the silicon dioxide. Opaque sections are represented by diagonal line whereas transparent sections are represented without lines. Accordingly, mask section 18 represents an opaque section under which an opening will be made in the silicon dioxide, whereas the remainder of the mask section about the silicon wafer is represented as transparent. An operator positions the mask 16 relative to the wafer 10. Thereafter, the wafer is exposed to a light source through the mask. The transparent sections pass the light and develop the photoresist material. The opaque sections resist the light which prevents the resist material from developing. The wafer is next washed in a suitable developer to remove the unexposed photoresist material. The silicon dioxide is exposed in the area where the photoresist is removed. Thereafter, the wafer is subjected to an etchant which will attack the silicon dioxide, but leave unaffected both the silicon material thereby exposed and also the photoresist material. This leaves a bare silicon surface so that the portion exposed can receive a suitable diffusion. One suitable etchant is a combination of ammonium fluoride ($NH_4F$) and hydrofluoric (HF) acid. Typically, 10–30 parts of ammonium fluoride to 1–4 parts of hydrofluoric acid are combined. The etching interval is in the range from 5½ to 8 minutes. The etching establishes a first aperture 20 in the silicon dioxide. Thereafter, the photoresist is removed with a suitable chemical.

The oxide wafer is now ready to receive a diffusion to establish a first junction 22 therein. The original wafer 10 is of an N type material. A P type region 22 is established by the diffusion. The P type region is established by well known diffusion or alloying technique. For example, a wafer is loaded into a capsule with the source of boron doped silicon, typically having a resistivity of the order of 0.002 ohm cm. The capsule is evacuated and sealed prior to placement into a diffusion oven. The capsule is inserted into the center of the flat zone of the oven for 60 minutes. Thereafter, the capsule is removed and immediately quenched under running tap water. The wafer is removed from the capsule, after opening, and inspected for resistivity and junction profile. The boron diffusion results in the N type region under the opening 20 being converted to a P type material. The diffusion time for the desired junction depth is well known in the prior art and described in the text "Handbook of Semiconductor Electronics," edited by L. P. Hunter, first edition, McGraw-Hill Co., New York, N.Y., 1956, section 7.

The wafer is next ready for another masking and diffusion operation. Referring to FIGURE 1C, the wafer is recoated with silicon dioxide to cover the opening 20. The regrowing silicon dioxide is applied after the boron diffusion process previously described. The process for applying the silicon dioxide is as previously described in connection with FIGURES 1A and 1B. The oxide thickness over the N region is of the order of 5000 angstroms whereas the oxide thickness over the P type region is of the order of 4000 angstroms. It is well known in oxide film growing that the increase in thickness of silicon dioxide on the pure silicon surface is greater than that on the existing silicon dioxide.

The wafer is now ready for a second opening to be placed therein. A mask 24 is disposed in co-planar relation with the wafer. Opaque area 26 must fit within the opaque area of the mask 16 (see FIGURE 1B). The difference between the opaque area 18 and 26 is referred to as a clearance area 27. A reduction in this clearance area will permit the device geometry to be reduced with resultant decrease in device capacitance and a resulting increase in device switching speed.

Figure 1D:
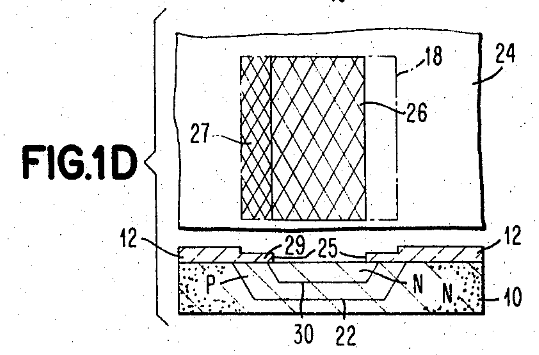
Figure 1E:
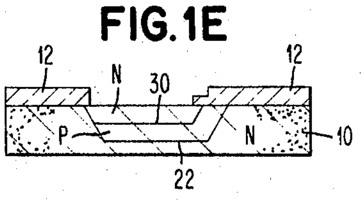

The clearance area permits a portion 29 of the silicon dioxide 12 to be retained in place over the P region after an opening 25, as shown in FIGURE 1D, is established therein. The opening 25 permits an N type diffusion to establish a junction 30. The process of re-establishing an N region is similar to that described for FIGURE 1C, but phosphorus is used in lieu of boron. The junction 30 is entirely within the junction 22 and spaced therefrom. The clearance area of the mask insures this spacing. In the absence of the clearance area, as shown in FIGURE 1E, a portion of the silicon dioxide would not extend over the P region which would result in an opening that would permit the junction 30 to engage the junction 22 after the second diffusion operation. The junctions 22 and 30, therefore, would be short-circulated which would render the device inoperative.

The opaque area 18 is of the order of 1.0 mil by 3.0 mils. The opaque area 26 is of the order of 0.4 mil by 2.8 mils. The clearance area represents approximately 15 percentage of the opaque area 18. A reduction in this clearance area would permit a collector base junction of smaller size. Additionally, the emitter base junction could be made larger with a resultant decrease in the current density at the emitter base junction.

The remaining paragraph of the specification will now be devoted to describing a process for reducing the clearance area with the attendant advantages of decreased device capacitance and current density.

Referring to FIGURES 2A through 2D, the present invention will be described with the same elements indicated in FIGURES 1A through 1E. Accordingly, elements appearing in FIGURES 2A through 2E and identical to those appearing in FIGURES 1A to 1E will employ the same reference characters as in FIGURES 1A through 1E but with the addition of prime marks.

Figure 2A:
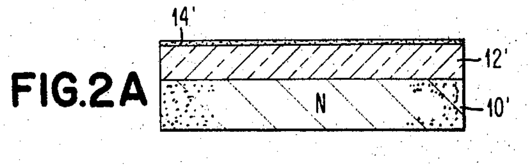
Figure 2B:
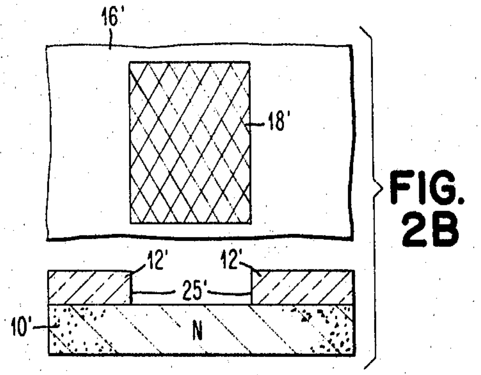

Referring to FIGURE 2A, the wafer 10' is coated with an insulating film 12' which is thicker than that described in FIGURE 1A. The insulating film may be any adherent material to the silicon surface. For purposes of the present invention, however, a silicon dioxide film has been selected for purposes of description only. The oxide is deposited by any of the previously described techniques to a thickness greater than 5000 to 6000 angstroms and less than 9000 to 10000 angstroms. The thickness of the oxide is selected to withstand two successive etchings but yet permit convenient photolithographic etching.

Figure 2C:
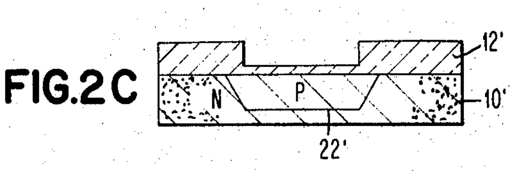

The oxide coated wafer is subjected to a photolithographic etching operation as described in FIGURE 1B. The etching interval, however, is substantially double that indicated in connection with FIGURE 1A or 10 to 16 minutes in order to permit the thick film to be etched away. A diffusion is conducted through the opening 25' to establish junction 22' as shown in FIGURE 2C. The wafer is recoated with a second oxide film to establish a film thickness of the order of 4000 angstroms in the opening 20'. An additional oxide growth occurs on the unetched oxide 12' to form a film with a minimum thickness of the order of 9000 to 10000 angstroms.

Figure 2D:
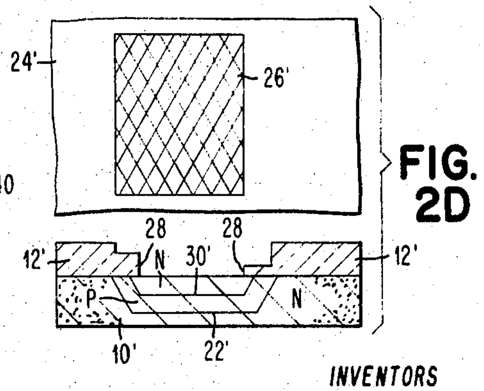

An opening 28' is established in the regrown oxide using the mask 24' as shown in FIGURE 2D. The mask 24' is disposed in co-planar relation with the device 10' to expose the photoresist material on the surface thereof where etching is not to occur. The opaque area 26' overlaps the former opening 25' for reasons indicated hereinafter. The unexposed photoresist material is cleaned away, as previously described, to expose the regrown oxide. The mask 24' will permit a portion of the thick oxide film to be exposed, as shown in FIGURE 2D. The etching step, however, is conducted for a length which will only permit the regrown oxide to be removed. Thus, the thick oxide film 12' will prevent the etchant from exposing the junction 22', as shown in FIGURE 2D. The junction 30′, when formed in the wafer 10′, will not contact the junction 22′. The spacing between the junctions 22′ and 30′ will be of the order of .5 to 1 micron. This spacing is due to the impurity diffusing outwardly during the heating treatments. Since the junction 22′ is subjected to two diffusion processes and a silicon oxide regrowth temperature process, it will have diffused further into crystal than the junction 22 which is only subject to a single diffusion temperature cycle. Thus, the spacing between the collector base junction 22′ and the emitter base junction 30′ is considerably less than that between the corresponding junctions in FIGURE 1A, which is due to the mask clearance. The reduced spacing shortens the collector base junction with the resultant reduced capacitance. The emitter base junction is increased with a resultant decrease in current density gradient along the junction 30′. Laboratory examination of similar devices made by prior art processes and the principles of the present invention show a decrease in collector-base capacitance of 10 to 15% and a corresponding switching improvement. The 10 to 15% decrease in collector-base capacitance is due the reduction in the collector area.

One possible problem resulting from a decrease in clearance area is inversion of the P regions in establishing the N region 30′. However, selecting the proper impurity concentrations for the regions 22′ and 30′ can preclude this possibility. Although an NPN device has been described, it is possible to employ the principles of the present invention in fabricating PNP devces. The likelihood of inversion occurring in a PNP type structure is remote.

The process of FIGURES 2A through 2D is also applicable to the fabrication of relatively small contact holes in the silicon dioxide. Referring to FIGURE 3, the device shown in FIGURE 2D has been recoated with silicon dioxide 31 to a thickness of approximately 4000 angstroms in the opening 28′. The oxide thickness over the collector region has been increased to approximately 9000 to 10000 angstroms in thickness. A contact mask 40 is disposed in coplanar relation with the wafer 10′. Opaque sections 42 and 42′ overlap the outer edges of the former opening 28′ and permit openings to be made in the oxide between the collector base and emitter base junction. Opaque section 44 permits an opening to be established in the emitter region 30′. The oxide openings may be coated with aluminum or like conductive material by evaporation. Metallization is well known in the art and described in a previously filed application, Ser. No. 484,553, dated Aug. 18, 1965, assigned to the same assignee as that of the present invention.

The oxide film 12′ permits the base emitter strips to be deposited without contacting the collector junction and without regard to any tolerance between the collector masks and the contact mask. This feature permits contacts to be deposited in circumstances where prior art masking techniques are not satisfactory or even operable.

Additionally, the contact mask enables the emitter contact to be formed simultaneously with the base contact strips. This feature expedites the process of fabricating semiconductor devices and lowers the cost thereof.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a semiconductor device comprising the steps of (a) forming an insulating first layer on a semiconductor, (b) establishing at least one opening in the layer to expose the semiconductor, (c) converting the conductivity type of the exposed semiconductor to establish a first junction, (d) further forming an insulating second layer to cover the exposed semiconductor and concurrently increase the thickness of said first layer, (e) masking the insulating second layer to define an area extending across the first junction, the area circumscribing a portion of the insulating second layer formed within said one opening and a portion of the second layer covering said first layer, and (f) removing said area in an amount sufficient to form a second opening exposing substantially only the portion of said semiconductor covered by said second layer within the one opening.

2. The invention defined in claim 1 further including the steps of (a) reconverting at last a portion of the converted conductivity type back to the original conductivity type to establish a second junction spaced from said first junction, (b) forming an insulating third layer to cover the second layer and the exposed semiconductor, and (c) removing the third layer in an area to define an opening in the layer to expose a conductivity type of said device.

3. The invention defined in claim 2 wherein the insulating layer is silicon dioxide of a thickness about 9,000 to 10000 angstroms and the separation between the first and second junction is about 0.5 to 1 micron.

References Cited

UNITED STATES PATENTS

| | | | |
|---|---|---|---|
| 3,247,428 | 4/1966 | Perri et al. | 29—578 |
| 3,270,256 | 8/1966 | Mills et al. | |
| 3,307,079 | 2/1967 | Eisenhower et al. | 29—578 X |
| 3,339,274 | 9/1967 | Saia et al. | 29—578 |

PAUL M. COHEN, Primary Examiner